United States Patent
Lee

(10) Patent No.: US 7,416,982 B2
(45) Date of Patent: Aug. 26, 2008

(54) SEMICONDUCTOR DEVICES AND METHODS FOR MANUFACTURING THE SAME

(75) Inventor: Jae-Suk Lee, Icheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 376 days.

(21) Appl. No.: 11/254,441

(22) Filed: Oct. 20, 2005

(65) Prior Publication Data

US 2006/0138669 A1  Jun. 29, 2006

(30) Foreign Application Priority Data

Dec. 23, 2004  (KR) .................. 10-2004-0111040

(51) Int. Cl.
*H01L 21/44* (2006.01)
(52) U.S. Cl. .................. 438/687; 438/627; 438/650; 257/E21.585; 257/E23.145
(58) Field of Classification Search .................. 438/627, 438/650, 687
See application file for complete search history.

(56) References Cited

U.S. PATENT DOCUMENTS

| 6,713,373 | B1* | 3/2004 | Omstead .................. 438/608 |
| 7,285,308 | B2* | 10/2007 | Hendrix et al. .................. 427/248.1 |
| 2001/0026963 | A1* | 10/2001 | Itatani et al. .................. 438/149 |
| 2003/0019760 | A1* | 1/2003 | Hardee et al. .................. 205/575 |
| 2004/0235241 | A1* | 11/2004 | Anma et al. .................. 438/239 |
| 2005/0206000 | A1* | 9/2005 | Aggarwal et al. .................. 257/758 |
| 2006/0063379 | A1* | 3/2006 | Dory et al. .................. 438/643 |
| 2007/0257369 | A1* | 11/2007 | Huang .................. 257/758 |
| 2007/0298608 | A1* | 12/2007 | Johnston et al. .................. 438/643 |

FOREIGN PATENT DOCUMENTS

| KR | 1020030025494 | 3/2003 |
| KR | 1020030050059 | 6/2003 |

OTHER PUBLICATIONS

Kim, Hui Jin, Method for Fabricating Copper Interconnection of Semiconductor Device, English Abstract of Korean Patent Publication 1020030050059, Jun. 25, 2003, Korean Intellectual Property Office, Republic of Korea.

Choi, Gil Hyeon et al., Semiconductor Device Including Contact Between Ruthenium Layer and Metal Layer and Fabricating Method Thereof, English Abstract of Korean Patent Publication 1020030025494, Mar. 29, 2003, Korean Intellectual Property Office, Republic of Korea.

* cited by examiner

*Primary Examiner*—Alexander G Ghyka
(74) *Attorney, Agent, or Firm*—Andrew D. Fortney

(57) ABSTRACT

Semiconductor devices having a copper line layer and methods for manufacturing the same are disclosed. An illustrated semiconductor device comprises a damascene insulating layer having a contact hole, a barrier metal layer including a first ruthenium layer, a ruthenium oxide layer and a second ruthenium layer, a seed copper layer formed on the barrier metal layer, and a copper line layer made of a Cu—Ag—Au solid solution. A disclosed example method of manufacturing a semiconductor device reduces and/or prevents contact characteristic degradation of the barrier metal layer with the silicon substrate or the damascene insulating layer. In addition, by forming the copper line layer made of the Cu—Ag—Au solid solution, long term device reliability may be improved.

6 Claims, 4 Drawing Sheets

SEMICONDUCTOR DEVICES AND METHODS FOR MANUFACTURING THE SAME

FIELD OF THE DISCLOSURE

The present disclosure relates generally to semiconductor fabrication and, more particularly, to semiconductor devices having a copper line layer and methods for manufacturing the same.

BACKGROUND

Generally, a copper line layer is used as a line layer in semiconductor devices. However, the copper line layer is difficult to pattern, so a damascene process is usually used to form the copper line layer.

FIG. 1 and FIG. 2 are cross-sectional views illustrating a conventional method for forming a copper line layer in a semiconductor device.

Referring to FIG. 1, in the conventional method for forming a copper line layer in a semiconductor device, a damascene insulating layer 105 having contact holes 110 and 115 is formed on a silicon substrate 100. A tantalum nitride (TaN) layer and a tantalum (Ta) layer are sequentially formed in the contact holes 110 and 115 of the damascene insulating layer 105, and thus, a barrier metal layer 120 is formed therein. Subsequently, a seed copper layer 125 is formed on the barrier metal layer 120.

Referring to FIG. 2, a copper line layer 130 is formed on a seed copper layer 125a so as to fill the contact holes. To form such a copper line layer 130, a copper layer is first formed to sufficiently fill the contact holes 110 and 115. Then, a chemical mechanical polishing process is performed to form a barrier metal layer 120a and the seed copper layer 125a confined in the contact holes 110 and 115. FIG. 2 shows the seed copper layer 125a separately, but it should be understood that it may be included in the copper line layer 130.

In the conventional method of FIGS. 1-2, a contact characteristic of the barrier metal layer with the silicon substrate or the damascene insulating layer is degraded because the tantalum nitride (TaN) layer of the barrier metal layer directly contacts the damascene insulating layer. In addition, although a pure copper (Cu) line layer has a relatively better electromigration (EM) characteristic than aluminum (Al) due to its heavier weight, it is understood that such a relative merit is not sufficient. Therefore, the reliability of such a device may also become deteriorated if it is used for a long time.

Figure 1:
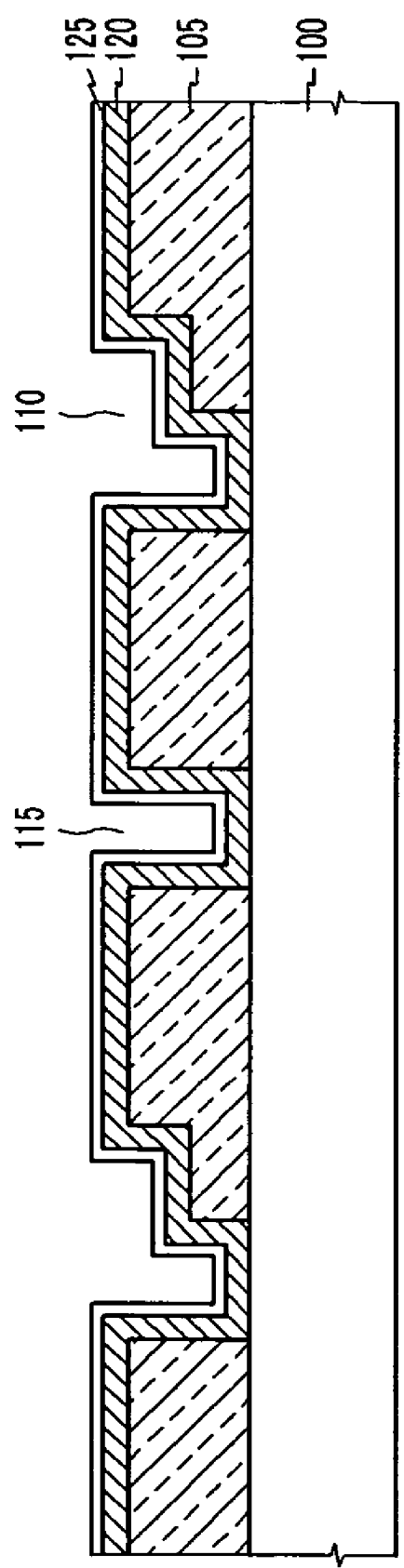
FIG. 1 and FIG. 2 are cross-sectional views illustrating a conventional method for forming a copper line layer of a semiconductor device.
Figure 2:
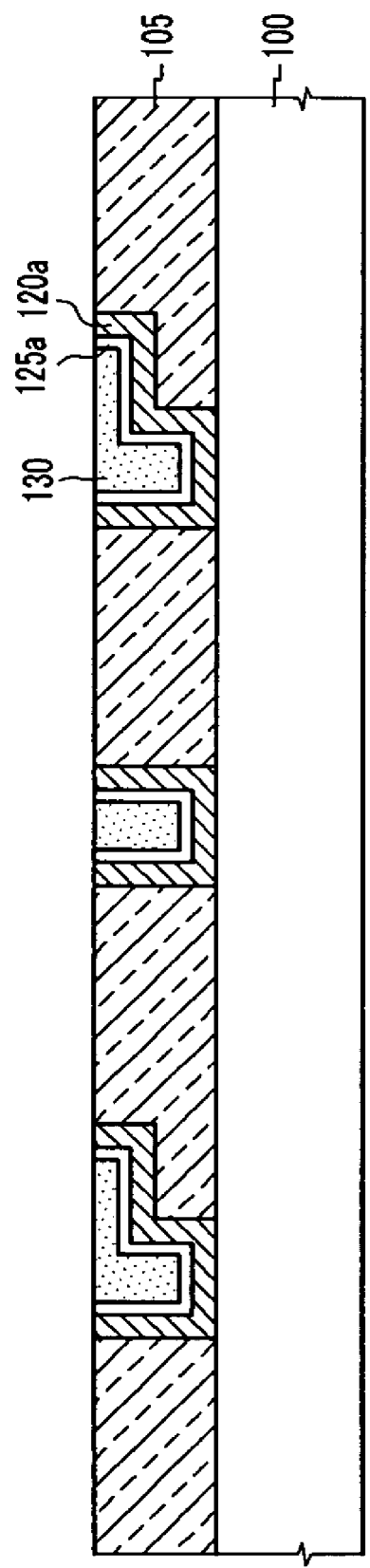

To clarify multiple layers and regions, the thickness of the layers are enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, means that the referenced part is either in contact with the other part, or that the referenced part is above the other part with one or more intermediate part(s) located therebetween. Stating that any part is in contact with another part means that there is no intermediate part between the two parts.

DETAILED DESCRIPTION

Figure 3:
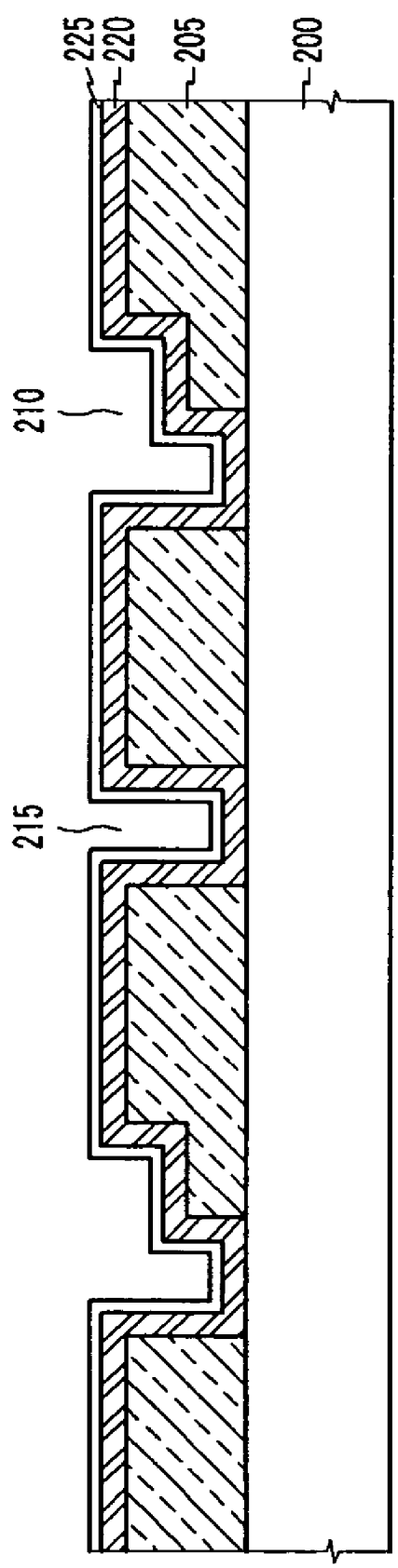
FIG. 3 and FIG. 4 are cross-sectional views illustrating an example method for forming a copper line layer in a semiconductor device performed in accordance with the teachings of the present invention.

Referring to FIG. 3, a damascene insulating layer 205 having contact holes 210 and 215 is formed on a silicon substrate 200 in a semiconductor device. The contact holes 210 and 215 may be formed in various shapes. In this patent, the term "contact hole" is to be understood to have a broad meaning. For example, the term "contact hole" should be understood to include a via hole formed on the lower metal layer and is not limited to any particular shape or size unless otherwise explicitly stated.

A first ruthenium (Ru) layer, a ruthenium oxide ($RuO_2$) layer, and a second ruthenium (Ru) layer are sequentially formed in the contact holes 210 and 215 of the damascene insulating layer 205 so as to form a barrier metal layer 220. The first ruthenium layer, the ruthenium oxide layer, and the second ruthenium layer are respectively formed at a thickness of about 10-500 Å. The ruthenium oxide layer is formed by exposing the first ruthenium layer under nitrogen oxide ($N_2O$) plasma or oxygen ($O_2$) plasma.

In the illustrated example, the first ruthenium layer acts as a contact layer that improves a contact characteristic with the silicon substrate or the damascene insulating layer. The ruthenium oxide layer acts as a diffusion barrier layer that prevents diffusion of copper. The second ruthenium layer is used as a contact layer to improve a contact characteristic with copper, and also as a diffusion barrier layer to prevent a diffusion of copper. Subsequently, a seed copper layer 225 is formed on the barrier metal layer 220 in the contact holes 210 and 215.

Figure 4:
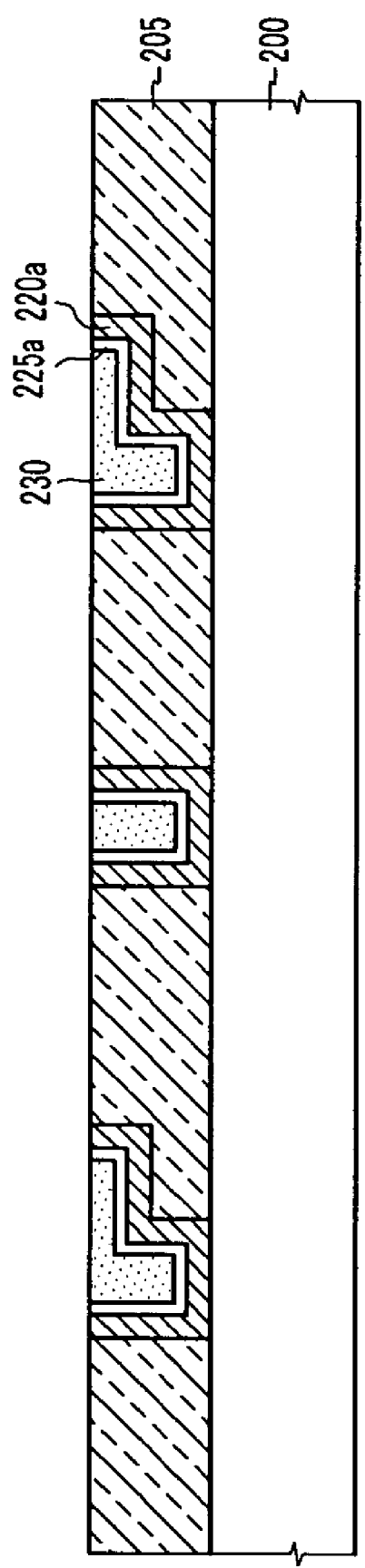

Referring to FIG. 4, a copper line layer 230 made of a Cu—Ag—Au solid solution is formed by electroplating on a seed copper layer 225a so as to fill the contact holes 210 and 215. The Cu—Ag—Au solid solution can be easily formed with Cu, Ag, and Au. In addition, the Cu—Ag—Au solid solution has a good EM characteristic since the Cu—Ag—Au solid solution includes Ag and Au which are heavier than Cu. The Ag and Au are respectively contained in the copper line layer made of the Cu—Ag—Au solid solution at less than 5 weight %. To form such a copper line layer 230, a copper layer is first formed to sufficiently fill the contact holes 210 and 215. A chemical mechanical polishing process is then performed to form a barrier metal layer 220a and the seed copper layer 225a which are within and confined to the contact holes 210 and 215. FIG. 4 shows the seed copper layers 225a separately, but it should be understood that it may be included in the copper line layer 230.

As described above, an example semiconductor device constructed in accordance with the teachings of the present invention includes a barrier metal layer and a copper line layer, wherein the barrier metal layer includes a first ruthenium layer, a ruthenium oxide layer, and a second ruthenium layer, and wherein the copper line layer is made of a Cu—Ag—Au solid solution.

Contact characteristic degradation of the barrier metal layer with the silicon substrate or the damascene insulating layer of such an example semiconductor device is reduced and may be prevented. In addition, by forming the copper line layer with the Cu—Ag—Au solid solution, long term device reliability may be improved.

In view of the foregoing, persons of ordinary skill in the art will appreciate that example semiconductor devices having an improved barrier metal layer and copper line layer and methods for manufacturing the same have been disclosed. An example semiconductor device disclosed herein has a barrier metal layer which exhibits an improved contact characteristic with a silicon substrate or a damascene insulating layer. Further, the copper line layer of such an example semiconductor device has improved long term reliability.

An example semiconductor device disclosed herein includes a damascene insulating layer formed on a silicon substrate and having a contact hole therein, a barrier metal layer including a first ruthenium layer, a ruthenium oxide layer, and a second ruthenium layer which are sequentially formed in the contact hole of the damascene insulating layer, a seed copper layer formed on the barrier metal layer in the contact hole, and a copper line layer including a Cu—Ag—Au solid solution and formed on the seed copper layer to fill the contact hole.

The Ag and Au may respectively be contained in the copper line layer made of the Cu—Ag—Au solid solution at less than 5 weight %. The first ruthenium layer of the illustrated example acts as a contact layer that improves a contact characteristic with the silicon substrate or the damascene insulating layer. The ruthenium oxide layer of the illustrated example acts as a diffusion barrier layer that prevents diffusion of copper. The second ruthenium layer of the illustrated example is used as a contact layer to improve a contact characteristic with copper, and also as a diffusion barrier layer to prevent copper diffusion.

The first ruthenium layer, the ruthenium oxide layer, and the second ruthenium layer may be respectively formed at a thickness of about 10-500 Å.

In a disclosed example method for forming a copper line of a semiconductor device, a damascene insulating layer having a contact hole is formed on a silicon substrate, and then a barrier metal layer is formed by sequentially forming a first ruthenium layer, a ruthenium oxide layer, and the second ruthenium layer in the contact hole of the damascene insulating layer. Subsequently, a seed copper layer is formed on the barrier metal layer in the contact hole, and lastly a copper line layer including a Cu—Ag—Au solid solution is formed on the seed copper layer to fill the contact hole. The ruthenium oxide layer of the illustrated example is formed by exposing the first ruthenium layer under nitrogen oxide ($N_2O$) plasma or oxygen ($O_2$) plasma.

The method of the illustrated example can reduce and/or prevent contact characteristic degradation of the barrier metal layer with the silicon substrate or the damascene insulating layer, and it can also improve long term reliability of devices by forming the copper line layer with the Cu—Ag—Au solid solution.

It is noted that this patent claims priority from Korean Patent Application Serial Number 10-2004-0111040, which was filed on Dec. 23, 2004, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for manufacturing a semiconductor device, comprising:
    forming a damascene insulating layer above a silicon substrate, the damascene insulating layer having a contact hole;
    forming a barrier metal layer by sequentially forming a first ruthenium layer, a ruthenium oxide layer, and a second ruthenium layer in the contact hole of the damascene insulating layer; and
    forming a copper line layer including a Cu—Ag—Au solid solution to fill the contact hole.

2. A method as defined in claim 1, further comprising forming a seed copper layer on the barrier metal layer in the contact hole, wherein the copper line layer is formed on the seed copper layer.

3. A method as defined in claim 1, wherein the first ruthenium layer, the ruthenium oxide layer, and the second ruthenium layer are respectively formed at a thickness of about 10-500 Å.

4. A method as defined in claim 1, wherein the ruthenium oxide layer is formed by exposing the first ruthenium layer under nitrogen oxide plasma or oxygen plasma.

5. A method as defined in claim 1, wherein the Cu—Ag—Au solid solution includes AG and AU, and the Ag and Au are respectively contained in the copper line layer made of the Cu—Ag—Au solid solution at less than 5 weight %.

6. A method as defined in claim 1, wherein:
    the first ruthenium layer, the ruthenium oxide layer, and the second ruthenium layer are respectively formed at a thickness of about 10-500 Å;
    the ruthenium oxide layer is formed by exposing the first ruthenium layer under nitrogen oxide plasma or oxygen plasma; and
    the Cu—Ag—Au solid solution includes AG and AU, and the Ag and Au are respectively contained in the copper line layer made of the Cu—Ag—Au solid solution at less than 5 weight %.

* * * * *